(12) United States Patent
Oganesian et al.

(10) Patent No.: US 8,759,973 B2
(45) Date of Patent: Jun. 24, 2014

(54) MICROELECTRONIC ASSEMBLIES HAVING COMPLIANCY AND METHODS THEREFOR

(75) Inventors: Vage Oganesian, Sunnyvale, CA (US); Guilian Gao, San Jose, CA (US); Belgacem Haba, Saratoga, CA (US); David Ovrutsky, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 144 days.

(21) Appl. No.: 13/335,022

(22) Filed: Dec. 22, 2011

(65) Prior Publication Data
US 2012/0091582 A1    Apr. 19, 2012

Related U.S. Application Data

(60) Continuation of application No. 12/784,806, filed on May 21, 2010, now Pat. No. 8,115,308, which is a division of application No. 11/643,021, filed on Dec. 20, 2006, now Pat. No. 7,749,886.

(51) Int. Cl.
*H01L 23/48* (2006.01)

(52) U.S. Cl.
USPC ............ 257/737; 257/738; 257/E21.508; 257/E23.021

(58) Field of Classification Search
None
See application file for complete search history.

(56) References Cited

U.S. PATENT DOCUMENTS

| | | |
|---|---|---|
| 4,001,870 A | 1/1977 | Saiki et al. |
| 4,021,838 A | 5/1977 | Warwick et al. |
| 4,190,855 A | 2/1980 | Inoue et al. |
| 4,284,563 A | 8/1981 | Wong |
| 4,300,153 A | 11/1981 | Hayakawa et al. |
| 4,365,264 A | 12/1982 | Mukai et al. |
| 4,381,602 A | 5/1983 | McIver |
| 4,396,936 A | 8/1983 | McIver et al. |
| 4,618,878 A | 10/1986 | Aoyama et al. |
| 4,642,889 A | 2/1987 | Grabbe |
| 4,671,849 A | 6/1987 | Chen et al. |
| 4,716,049 A | 12/1987 | Patraw |
| 4,783,594 A | 11/1988 | Schulte et al. |
| 4,813,129 A | 3/1989 | Kamezos |
| 4,885,126 A | 12/1989 | Polonio |

(Continued)

FOREIGN PATENT DOCUMENTS

| | | |
|---|---|---|
| JP | 57121255 | 7/1982 |
| JP | 1155633 | 6/1989 |

(Continued)

OTHER PUBLICATIONS

Japanese Office Action for Application No. 2007-557186 dated Jul. 12, 2011.
Japanese Office Action for Application No. 2007-557186 dated Oct. 27, 2012.
Korean Office Action for 10-2007-7020400 dated May 10, 2012.
Japanese Office Action for Application No. 2009-542929 dated Jun. 1, 2012.

(Continued)

*Primary Examiner* — Daniel Whalen
(74) *Attorney, Agent, or Firm* — Lerner, David, Littenberg, Krumholz & Mentlik, LLP

(57) ABSTRACT

A microelectronic assembly is disclosed that includes a semiconductor wafer with contacts, compliant bumps of dielectric material overlying the first surface of the semiconductor wafer, and a dielectric layer overlying the first surface of the semiconductor wafer and edges of the compliant bumps. The compliant bumps have planar top surfaces which are accessible through the dielectric layer. Conductive traces may be electrically connected with contacts and extend therefrom to overlie the planar top surfaces of the compliant bumps. Conductive elements may overlie the planar top surfaces in contact with the conductive traces.

20 Claims, 9 Drawing Sheets

(56) References Cited

U.S. PATENT DOCUMENTS

| | | |
|---|---|---|
| 4,902,606 A | 2/1990 | Patraw |
| 4,924,353 A | 5/1990 | Patraw |
| 4,955,132 A | 9/1990 | Ozawa et al. |
| 4,962,985 A | 10/1990 | LeGrange |
| 4,977,441 A | 12/1990 | Ohtani et al. |
| 5,001,542 A | 3/1991 | Tsukagoshi et al. |
| 5,070,297 A | 12/1991 | Kwon et al. |
| 5,072,520 A | 12/1991 | Nelson |
| 5,082,811 A | 1/1992 | Bruno |
| 5,110,388 A | 5/1992 | Komiyama et al. |
| 5,140,404 A | 8/1992 | Fogal et al. |
| 5,148,265 A | 9/1992 | Khandros et al. |
| 5,148,266 A | 9/1992 | Khandros et al. |
| 5,180,311 A | 1/1993 | Schreiber et al. |
| 5,187,020 A | 2/1993 | Kwon et al. |
| 5,194,930 A | 3/1993 | Papathomas et al. |
| 5,203,076 A | 4/1993 | Banerji et al. |
| 5,225,966 A | 7/1993 | Basavanhally et al. |
| 5,249,101 A | 9/1993 | Frey et al. |
| 5,265,329 A | 11/1993 | Jones et al. |
| 5,302,550 A | 4/1994 | Hirota et al. |
| 5,310,699 A | 5/1994 | Chikawa et al. |
| 5,316,788 A | 5/1994 | Dibble et al. |
| 5,349,240 A | 9/1994 | Narita et al. |
| 5,355,283 A | 10/1994 | Marrs et al. |
| 5,363,277 A | 11/1994 | Tanaka et al. |
| 5,371,404 A | 12/1994 | Juskey et al. |
| 5,393,697 A | 2/1995 | Chang et al. |
| 5,414,298 A | 5/1995 | Grube et al. |
| 5,430,329 A | 7/1995 | Harada et al. |
| 5,431,328 A | 7/1995 | Chang et al. |
| 5,431,571 A | 7/1995 | Hanrahan et al. |
| 5,455,390 A | 10/1995 | DiStefano et al. |
| 5,477,611 A | 12/1995 | Sweis et al. |
| 5,483,106 A | 1/1996 | Echigo et al. |
| 5,489,749 A | 2/1996 | DiStefano et al. |
| 5,508,228 A | 4/1996 | Nolan et al. |
| 5,525,545 A | 6/1996 | Grube et al. |
| 5,563,445 A | 10/1996 | Iijima et al. |
| 5,600,103 A | 2/1997 | Odaira et al. |
| 5,604,380 A | 2/1997 | Nishimura et al. |
| 5,656,862 A | 8/1997 | Papathomas et al. |
| 5,659,952 A | 8/1997 | Kovac et al. |
| 5,666,270 A | 9/1997 | Matsuda et al. |
| 5,679,977 A | 10/1997 | Khandros et al. |
| 5,682,061 A | 10/1997 | Khandros et al. |
| 5,707,902 A | 1/1998 | Chang et al. |
| 5,734,547 A | 3/1998 | Iversen |
| 5,749,997 A | 5/1998 | Tang et al. |
| 5,766,987 A | 6/1998 | Mitchell et al. |
| 5,772,451 A | 6/1998 | Dozier, II et al. |
| 5,777,379 A | 7/1998 | Karavakis et al. |
| 5,789,271 A | 8/1998 | Akram |
| 5,790,377 A | 8/1998 | Schreiber et al. |
| 5,874,781 A | 2/1999 | Fogal et al. |
| 5,874,782 A * | 2/1999 | Palagonia ............... 257/778 |
| 5,885,849 A | 3/1999 | DiStefano et al. |
| 5,929,517 A | 7/1999 | Distefano et al. |
| 5,937,758 A | 8/1999 | Maracas et al. |
| 5,956,235 A | 9/1999 | Kresge et al. |
| 5,989,936 A | 11/1999 | Smith et al. |
| 6,030,856 A | 2/2000 | DiStefano et al. |
| 6,043,563 A | 3/2000 | Eldridge et al. |
| 6,084,301 A | 7/2000 | Chang et al. |
| 6,086,386 A | 7/2000 | Fjelstad et al. |
| 6,130,116 A | 10/2000 | Smith et al. |
| 6,133,639 A | 10/2000 | Kovac et al. |
| 6,147,401 A | 11/2000 | Solberg |
| 6,177,636 B1 | 1/2001 | Fjelstad |
| 6,184,576 B1 | 2/2001 | Jones et al. |
| 6,194,291 B1 | 2/2001 | DiStefano et al. |
| 6,197,613 B1 | 3/2001 | Kung et al. |
| 6,211,572 B1 | 4/2001 | Fjelstad et al. |
| 6,230,400 B1 | 5/2001 | Tzanavaras et al. |
| 6,249,051 B1 | 6/2001 | Chang et al. |
| 6,255,738 B1 | 7/2001 | Distefano et al. |
| 6,277,669 B1 | 8/2001 | Kung et al. |
| 6,284,563 B1 | 9/2001 | Fjelstad |
| 6,313,402 B1 | 11/2001 | Schreiber et al. |
| 6,326,678 B1 | 12/2001 | Kamezos et al. |
| 6,337,445 B1 | 1/2002 | Abbott et al. |
| 6,359,335 B1 | 3/2002 | Distefano et al. |
| 6,373,141 B1 | 4/2002 | DiStefano et al. |
| 6,433,427 B1 | 8/2002 | Wu et al. |
| 6,458,411 B1 | 10/2002 | Goossen et al. |
| 6,465,878 B2 | 10/2002 | Fjelstad et al. |
| 6,507,095 B1 | 1/2003 | Hashimoto et al. |
| 6,525,429 B1 | 2/2003 | Kovac et al. |
| 6,537,854 B1 | 3/2003 | Chang et al. |
| 6,555,908 B1 | 4/2003 | Eichelberger et al. |
| 6,586,275 B2 | 7/2003 | Kim et al. |
| 6,624,653 B1 | 9/2003 | Cram |
| 6,638,870 B2 | 10/2003 | Brintzinger et al. |
| 6,642,136 B1 | 11/2003 | Lee et al. |
| 6,660,626 B1 | 12/2003 | Lin |
| 6,710,456 B1 | 3/2004 | Jiang et al. |
| 6,746,898 B2 | 6/2004 | Lin et al. |
| 6,767,818 B1 | 7/2004 | Chang et al. |
| 6,767,819 B2 | 7/2004 | Lutz |
| 6,803,663 B2 | 10/2004 | Hashimoto et al. |
| 6,847,101 B2 | 1/2005 | Fjelstad et al. |
| 6,870,272 B2 | 3/2005 | Kovac et al. |
| 6,914,333 B2 | 7/2005 | Lo et al. |
| 6,927,489 B1 | 8/2005 | Yaguchi et al. |
| 6,930,388 B2 | 8/2005 | Yamaguchi et al. |
| 6,936,928 B2 | 8/2005 | Hedler et al. |
| 6,940,177 B2 | 9/2005 | Dent et al. |
| 6,972,490 B2 | 12/2005 | Chang et al. |
| 6,979,591 B2 | 12/2005 | Hedler et al. |
| 6,989,605 B2 | 1/2006 | Hashimoto et al. |
| 7,265,045 B2 | 9/2007 | Lee et al. |
| 7,423,346 B2 | 9/2008 | Lin et al. |
| 2002/0063332 A1 | 5/2002 | Yamaguchi et al. |
| 2002/0079575 A1 | 6/2002 | Hozoji et al. |
| 2002/0084528 A1 | 7/2002 | Kim et al. |
| 2002/0089058 A1 | 7/2002 | Hedler et al. |
| 2002/0096787 A1 | 7/2002 | Fjelstad |
| 2002/0121702 A1 | 9/2002 | Higgins |
| 2002/0137256 A1 | 9/2002 | Knickerbocker et al. |
| 2002/0151164 A1 | 10/2002 | Jiang et al. |
| 2003/0049884 A1 | 3/2003 | Lutz |
| 2003/0057567 A1 | 3/2003 | Hedler et al. |
| 2004/0043538 A1 | 3/2004 | Lo et al. |
| 2004/0164400 A1 | 8/2004 | Meyer-Berg |
| 2004/0222518 A1 | 11/2004 | Haba et al. |
| 2004/0227225 A1 | 11/2004 | Fjelstad et al. |
| 2005/0097727 A1 | 5/2005 | Iijima et al. |
| 2005/0127527 A1 | 6/2005 | Haimerl et al. |
| 2005/0146030 A1 | 7/2005 | Miyazaki |
| 2005/0260794 A1* | 11/2005 | Lo et al. ............... 438/108 |
| 2006/0138647 A1 | 6/2006 | Crisp et al. |
| 2006/0194365 A1 | 8/2006 | Haba |
| 2008/0090333 A1 | 4/2008 | Haba et al. |

FOREIGN PATENT DOCUMENTS

| | | |
|---|---|---|
| JP | 1164054 | 6/1989 |
| JP | 1235261 | 9/1989 |
| JP | 1253926 | 10/1989 |
| JP | 1-278755 | 11/1989 |
| JP | 2056941 | 2/1990 |
| JP | 4-091443 | 3/1992 |
| JP | 4-137641 | 5/1992 |
| JP | 04280458 | 10/1992 |
| JP | 05251455 | 9/1993 |
| JP | 09-064233 A | 3/1997 |
| JP | 2000269371 A | 9/2000 |
| JP | 2001144204 A | 5/2001 |
| JP | 2001332653 A | 11/2001 |
| JP | 2002217227 A | 8/2002 |
| JP | 2002319635 A | 10/2002 |
| JP | 2003197655 A | 7/2003 |
| JP | 2004273592 A | 9/2004 |
| JP | 2006228940 A | 8/2006 |

(56) References Cited

FOREIGN PATENT DOCUMENTS

| | | |
|---|---|---|
| WO | 9403036 | 2/1994 |
| WO | 9832170 A1 | 7/1998 |
| WO | 98/52225 | 11/1998 |
| WO | 99/05895 | 2/1999 |
| WO | 2006091793 A1 | 8/2006 |

OTHER PUBLICATIONS

"Methods of Testing Chips and Joining Chips to Substrates," 2244 Research Disclosure, Feb. 1991, Elmsworth, GB. 32290.

Office Action from Chineses Application No. 200780049974.7 dated May 20, 2010.

* cited by examiner

MICROELECTRONIC ASSEMBLIES HAVING COMPLIANCY AND METHODS THEREFOR

CROSS REFERENCE TO RELATED APPLICATIONS

This application is a continuation of U.S. patent application Ser. No. 12/784,806, filed on May 21, 2010, which is a divisional of U.S. Pat. No. 7,749,886, filed on Dec. 20, 2006, and is related to U.S. patent application Ser. No. 11/360,230, filed Feb. 23, 2006, the disclosures of which are hereby incorporated by reference herein.

BACKGROUND OF THE INVENTION

The present invention relates to wafer-level and semiconductor chip packaging. More particularly, the present invention relates to improved compliant wafer and compliant semiconductor package structures and methods for making the same.

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices intended for high-frequency operation typically must be tested by applying high frequency signals. This requirement imposes constraints on the electrical characteristics of the signal paths in the test fixture, which further complicates construction of the test fixture.

Additionally, when testing wafers and packaged devices having solder balls connected with terminals, solder tends to accumulate on those parts of the test fixture that engage the solder balls. This accumulation of solder residue can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals that can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

Recently, DRAM packages have been developed that operate at frequencies above a few GHz, which may make it difficult to utilize wire bonding interconnections due to the high impedence of long wires. For conventional flip chip packages, thermal mismatch between printed circuit boards (CTE 14-16) and silicon (CTE 3-4) may cause delamination of peripheral BGA's. Thus, under ball packaging layers are preferably sufficiently compliant (e.g. low modulus and thick) in order to compensate for mechanical stresses that develop during thermal cycling.

The lithography method has a number of disadvantages. A first disadvantage is that the compliant layer has a thickness of about 40 microns formed by a spin coating process that requires very low rpm's. Such compliant layers tend to be non-uniform due to the low rpm's. A second problem is that the lithography process results in structures with straight walls or wall having inverted angles so as to result in high stress metallization at the top and bottom bump deflections. The screen printing method has a number of disadvantages including: 1) the screen printing process for polymers has poor accuracy so that the thickness variation of resultant bumps is 50-60 microns; and 2) the screen printing process results in low yield due to the large amount of deformed bumps.

In spite of the above advances, there remains a need for improved methods of making microelectronic packages and for microelectronic packages having compliant under ball bumps, such as DDR packages having compliant under ball bumps.

SUMMARY OF THE INVENTION

The present invention provides improved methods for making microelectronic packages having compliant under ball bumps such as silicone under ball bumps (SUB). In one embodiment, the invention uses a planarization step during which screen printed bumps are ground using a conventional grinding machine. After grinding the bumps, the sharp edges on the bumps may be smoothed by depositing a photoimageable layer such as a photoimageable silicone. Thus, in one embodiment, the under ball bumps are at least partially formed by screen printing compliant bumps on a wafer, applying a protective coating over the screen printed compliant bumps, planarizing the screen printed bumps using a grinding method, and smoothing the ground compliant bumps by applying an additional photoimageable compliant layer.

In one preferred embodiment of the present invention, a method of making a microelectronic assembly includes providing a microelectronic element having a first surface and contacts accessible at the first surface. The microelectronic element may include a semiconductor wafer, a wafer having one or more memory chips, or a wafer having one or more double-data-rate (DDR) chip such a DDR3 or DDR4 chip. In one embodiment, the microelectronic element may also include a single chip such as a single memory chip. The method includes providing compliant bumps over the first surface of the microelectronic element and depositing a sacrificial layer over the compliant bumps and the first surface of the microelectronic element, whereby the sacrificial layer covers the compliant bumps. The sacrificial layer may be a photoimageable layer. The sacrificial layer may include silicone.

In one embodiment, silicone based materials (3-2000 MPa) are good candidates for under ball dielectric materials or compliant layers. There are preferably at least two types of application methods for these materials. A first method involves printing silicone materials such as WL-6910 sold by Dow Corning. A second method involves using photoimageable materials. These two methods may be used alone or in combination.

The method desirably includes grinding the sacrificial layer and the compliant bumps so as to planarize top surfaces of the compliant bumps, whereby the planarized top surfaces of the compliant bumps are accessible through the sacrificial layer. In one embodiment, the planarized top surfaces are preferably substantially flat. The compliant bumps desirably have sloping sides surrounding the planarized top surfaces, whereby the sloping sides are exposed during the removing the sacrificial layer step. After the grinding step, the sacrificial layer is removed for exposing the contacts and the portion of the compliant bumps surrounding the planarized top surfaces. Conductive traces are preferably provided having first ends electrically connected with the contacts and second ends overlying the planarized top surfaces of the compliant bumps. The conductive traces are desirably made of a conductive material such as copper, gold, nickel and alloys, combinations and composites thereof. Conductive elements such as solder balls, conductive posts and conductive pins may be provided in contact with the second ends of the conductive traces. The conductive elements may be made of conductive materials such as copper, copper alloys, gold and combinations thereof. The method may also include dicing the microelectronic element to provide individual chip packages having at least one chip.

In one preferred embodiment, after removing the sacrificial layer, a silicone layer is deposited over the first surface of the microelectronic element and the compliant bumps. The silicone layer may be selectively removed so as to expose the contacts accessible at the first surface of the microelectronic element.

In one embodiment, the method includes providing conductive posts in contact with the second ends of the conductive traces, the conductive posts overlying the compliant bumps and projecting away from the first surface of the microelectronic element, whereby the conductive posts are electrically interconnected with the contacts of the microelectronic element. The conductive posts preferably have tips that define the highest point on the microelectronic assembly.

In one embodiment, the compliant bumps are provided by depositing a layer of a material having a modulus of elasticity in the range of 3-2000 MPa, and selectively removing portions of the layer of low modulus material for forming the compliant bumps. In another embodiment, the compliant bumps are provided by screen printing bumps of a curable material onto the first surface of the microelectronic element, and curing the curable material to form the compliant bumps. The compliant bumps are desirably made of a material selected from the group consisting of silicones, silicone-polyimide copolymers, flexibilized epoxies, polyimides, thermosetting polymers, fluoropolymers and thermoplastic polymers.

In one embodiment, the conductive posts have bases adjacent one of the compliant bumps and tips remote from the compliant bumps. The conductive posts desirably have a height of about 10-500 micrometers. In another embodiment, at least one conductive post has a frustoconical shape with the base having a diameter of about 30-600 micrometers and the tip having a diameter of about 10-200 micrometers.

In another preferred embodiment of the present invention, a method of making a microelectronic assembly includes providing a microelectronic element such as a semiconductor wafer or a DDR chip having a first surface and contacts accessible at the first surface, providing dielectric bumps over the first surface of the microelectronic element, and depositing a sacrificial layer over the dielectric bumps. The dielectric bumps may be made of a material such as silicones, silicone-polyimide copolymers or hybrid polymers, flexibilized epoxies, polyimides, thermosetting polymers, fluoropolymers and thermoplastic polymers. The method may include grinding the sacrificial layer and the dielectric bumps so as to planarize top surfaces of the dielectric bumps, whereby the planarized top surfaces are accessible through the sacrificial layer. After the grinding step, the sacrificial layer may be removed so as to further expose the dielectric bumps and to expose the contacts. A dielectric layer may be deposited over the first surface of the microelectronic element and the dielectric bumps. The dielectric layer may be selectively removed to expose the contacts accessible at the first surface of the microelectronic element. Conductive traces may be formed having first ends electrically connected with the contacts and second ends overlying the planarized top surfaces of the dielectric bumps. Conductive elements such as solder balls, conductive posts and conductive pins may be provided in contact with the second ends of the conductive traces.

The conductive traces may be made of a conductive material such as copper, gold, nickel and alloys, combinations and composites thereof. The conductive elements may be conductive posts disposed atop the dielectric bumps, whereby each conductive post has a height of about 50-300 micrometers. The conductive elements are preferably made of conductive materials such as copper, copper alloys, gold and combinations thereof.

In another preferred embodiment of the present invention, a method of making a microelectronic assembly includes providing a semiconductor wafer having a first surface and contacts accessible at the first surface, forming compliant bumps over the first surface of the semiconductor wafer, depositing a sacrificial layer over the compliant bumps, and grinding the sacrificial layer and the compliant bumps so as to planarize top surfaces of the compliant bumps, whereby the planarized top surfaces of the compliant bumps are accessible through the sacrificial layer. The method may include, after the grinding step, removing the sacrificial layer so as to expose the compliant bumps and the contacts, depositing a silicone layer over the first surface of the microelectronic element and the compliant bumps, and selectively removing the silicone layer so as to expose the contacts accessible at the first surface of the semiconductor wafer. Conductive traces are provided having first ends electrically connected with the contacts and second ends overlying the planarized top surfaces of the compliant bumps. Conductive elements are preferably provided in contact with the second ends of the conductive traces. The microelectronic element may be diced to provide a plurality of individual chip packages.

The conductive elements may be conductive posts. The conductive elements or the conductive posts may be plated atop the second ends of the conductive traces so that the conductive elements/posts overlie the compliant bumps.

A microelectronic assembly includes a semiconductor wafer having a first surface and contacts accessible at the first surface and compliant bumps overlying the first surface of the semiconductor wafer, whereby each compliant bump has a planar top surface such as a flat surface. The assembly desirably includes a silicone layer overlying the first surface of the semiconductor wafer and the compliant bumps, whereby the planar top surfaces of the compliant bumps and the contacts are accessible through the silicone layer. The assembly preferably includes conductive traces having first ends electrically connected with the contacts and second ends overlying the planarized top surfaces of the compliant bumps, and conductive elements in contact with the second ends of the conductive traces. The conductive elements may be solder balls, conductive posts or conductive pins. The semiconductor wafer may include one or more memory chips. The wafer may also include one or more double-data-rate (DDR) chips, such as a DDR3 or DDR4 chip.

In a preferred embodiment, the compliant bumps or compliant layer is preferably made of a material having a low modulus of elasticity. The compliant layer may be made of materials such as silicones, flexibilized epoxies, polyimides, thermosetting polymers, fluoropolymers and thermoplastic polymers.

The microelectronic assembly desirably includes elongated, electrically conductive elements for electrically interconnecting the conductive elements (e.g. conductive posts) and the contacts of the microelectronic element. The elongated, electrically conductive elements may include materials such as copper, gold, nickel and alloys, combinations and composites thereof. In a preferred embodiment, the elongated, electrically conductive elements may be bond ribbons or conductive traces. The elongated, electrically conductive elements preferably extend over the compliant bumps or dielectric bumps.

In one embodiment, at least one of the conductive posts may be disposed atop at least one of the compliant bumps. In other preferred embodiments, each conductive post is disposed atop one of the compliant bumps. In still other preferred embodiments, two or more conductive posts may be disposed atop a single compliant bump. Each conductive post desirably has a base adjacent the compliant bump or compliant layer and a tip remote from the compliant bump or compliant layer. The conductive posts preferably have a height that is higher than the thickness of the solder mask so that the posts are the highest/tallest structure on the microelectronic assembly. As a result, during testing of the microelectronic assembly, the tips of the conductive posts are the first elements to engage the conductive pads on a test board. In one preferred embodiment, the conductive posts desirably have a height of about 50-300 micrometers. In one preferred embodiment, at least one of the conductive posts has a frustoconical shape with a base having a diameter of about 100-600 micrometers and a tip having a diameter of about 40-200 micrometers. The conductive posts may be made of an electrically conductive material, such as copper, copper alloys, gold and combinations thereof.

The compliant bumps preferably have top surfaces that are spaced from the first surface of the microelectronic element and sloping surfaces that extend between the top surfaces of the compliant bumps and the first surface of the microelectronic element. The conductive traces desirably extend over the sloping surfaces of the compliant bumps.

These and other preferred embodiments of the present invention will be described in more detail below.

DETAILED DESCRIPTION OF PREFERRED EMBODIMENTS

Figure 1:
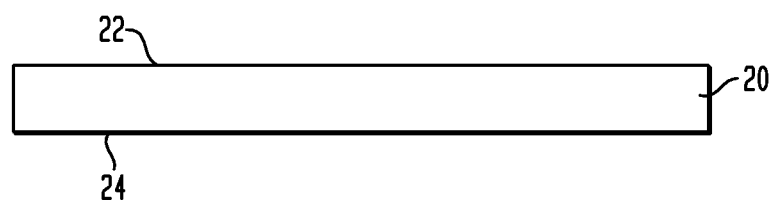
FIGS. 1-8A show a method of making a microelectronic assembly, in accordance with one preferred embodiment of the present invention.

Referring to FIG. 1, in accordance with a preferred embodiment of the present invention, a wafer 20 includes a top surface 22 having contacts (not shown) accessible at the top surface. The wafer 20 also includes a bottom surface 24 opposite the top surface 22. In one embodiment, the wafer is a semiconductor wafer having a plurality of semiconductor chips. In another embodiment, the wafer has a plurality of memory chips such as DRAM or DDR chips. In highly preferred embodiments, the wafer has one or more DDR3 or DDR4 chips.

Figure 2:
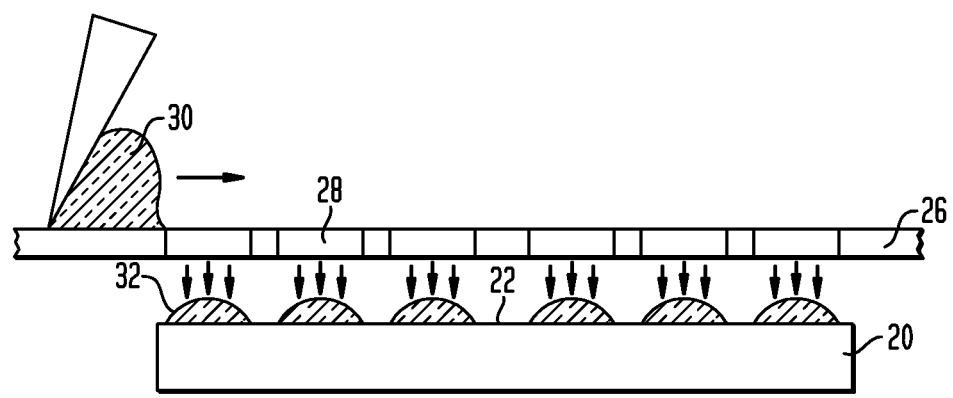

Referring to FIG. 2, a stencil or screen 26 having openings 28 is juxtaposed with a top surface 22 of the wafer 20. A curable material 30 such as silicone is screen printed through the openings 28 in the stencil and onto the top surface 22 of the wafer 20. The screen printed material 30 preferably forms a plurality of bumps 32 of a curable material that overlie the first surface 22 of the wafer 20. The plurality of curable bumps 32 preferably do not cover the contacts (not shown) accessible at the first surface 22 of the wafer 20. After the bumps have been stenciled onto the wafer, the bumps 32 are cured to provide compliant bumps.

In one embodiment, the wafer may be replaced by a single microelectronic chip, such as a memory chip. A dielectric passivation layer (not shown) may be deposited or adhered onto the top surface 22 of the wafer 20. The passivation layer may be a $SiO_2$ passivation layer commonly found on the contact-bearing surface of semiconductor chips. In another embodiment, a separate dielectric passivation layer may be used such as an epoxy resin, polyimide resin, photo-imageable dielectric, etc. When the separate passivation layer is used, the passivation layer may be spun onto and built up to a planar, sheet-like form on the top surface, or the dielectric sheet may be laminated to the top surface using any one of the electronic grade adhesives commonly known and used by those skilled in the art. The passivation layer preferably covers the top surface 22 of the wafer 20 and leaves the contacts (not shown) exposed so that a conductive element such as an elongated trace or bond ribbon may be attached (e.g. by plating) to the contacts.

In one embodiment, the compliant bumps are preferably deposited or laminated onto the exposed surface of the passivation layer (not shown). The compliant bumps may be formed and/or have a shape as disclosed in commonly assigned U.S. Pat. Nos. 6,211,572; 6,284,563; 6,465,878; 6,847,101 and 6,847,107, and co-pending U.S. application Ser. Nos. 09/020,647 and 10/873,883, the disclosures of which are hereby incorporated by reference herein. [TESSERA 078 line of cases] The compliant bumps may be stenciled, screened or transfer molded onto the passivation layer using a curable liquid which, when cured, adheres to the passivation layer. Alternatively, the compliant bumps may be adhered to the exposed surface of the passivation layer in the form of cured compliant pads using an electronic grade adhesive. The compliant bumps may be formed from a wide variety of materials, such as a low modulus of elasticity material. The compliant bumps may also be fabricated of polymeric and other materials such as silicones, flexibilized epoxies, polyimides and other thermosetting polymers, fluoropolymers and thermoplastic polymers.

A plating seed layer (not shown) may be deposited atop the aforementioned assembly, such as by using a sputtering operation. Typical plating seed layer materials include palladium (for electroless plating), titanium, tungsten nickel and chromium. In other preferred embodiments, however, seed layers made primarily of copper may be used.

The conductive traces preferably electrically interconnect the contacts near a first end of the conductive traces and extend to a second end that overlies one of the compliant bumps. The conductive traces may be plated directly onto the contacts. Preferred conductive trace materials include copper, gold, nickel and alloys, combinations and composites thereof.

A solder mask layer may be deposited or laminated over the top of the assembly so that only the second ends of the conductive traces are exposed. The masking layer may be a dielectric material. The solder mask may comprise a screened, exposed and developed or laminated sheet, a photoresisting material or may comprise a paralyne epoxy resin, polyimide resin, fluoropolymer, etc., which is deposited or laminated onto the assembly.

Figure 3:
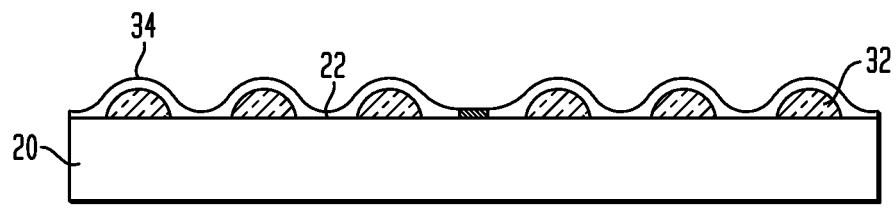

Referring to FIG. 3, a sacrificial protective coating 34 is preferably provided atop the compliant bumps 32. The sacrificial protective coating 34 covers the compliant bumps, the first surface 22 of the wafer 20, as well as the contacts [not shown] accessible at the first surface of the wafer. As will be described in more detail below, the sacrificial protective layer 34 provides a support matrix for the compliant bumps 32 and protects the first surface 22 of the wafer 20 during further processing steps.

Figure 4:
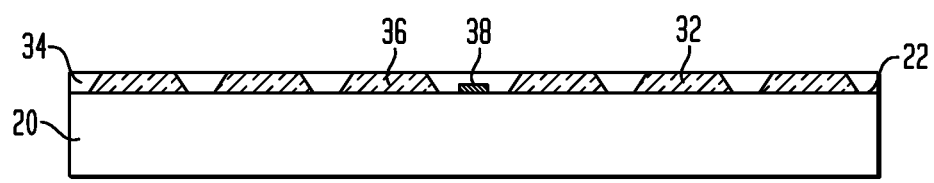

Referring to FIG. 4, the sacrificial protective layer 34 and the compliant bumps 32 are preferably planarized to form flat planar surfaces atop the bumps. In one embodiment, the compliant bumps are grinded or sanded for removing portions of the sacrificial protective layer and the compliant bumps. As shown in FIG. 4, portions of the sacrificial protective layer 34 are removed so as to expose portions of the compliant bumps 32 (i.e. the planar top surfaces). The compliant bumps are grinded or sanded so as to form substantially flat planar surfaces 36 atop the compliant bumps 32. The planar surfaces 36 are accessible and/or exposed through the sacrificial protective layer 34. The sacrificial protective layer 34 provides a support matrix that prevents the compliant bumps 32 from moving during the grinding process. In addition, the sacrificial layer 34 protects the one or more contacts 38 accessible at the first surface 22 of the wafer 20. Thus, the sacrificial protective layer 34 protects the first surface of the wafer and prevents contamination of the first surface that may be caused by residue from the ground compliant bumps 32.

Figure 5:
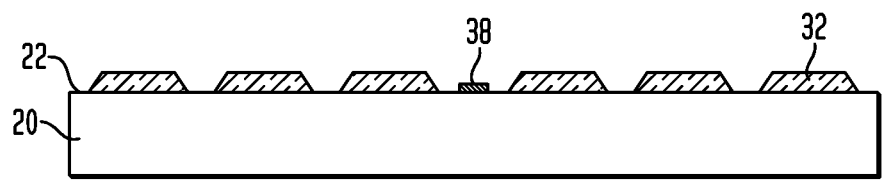

Referring to FIG. 5, after grinding the compliant bumps, the sacrificial layer is removed to expose the first surface 22 of the wafer 20, the one or more contacts 38 accessible at the first surface 22 and the sides of the compliant bumps 32.

Figure 6:
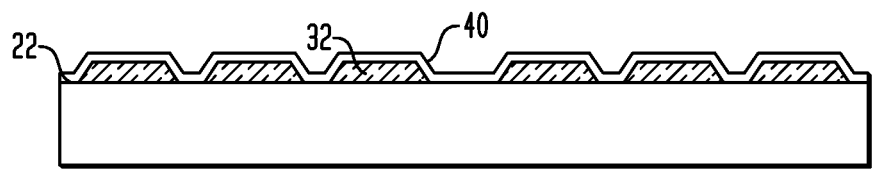

Referring to FIG. 6, a photoimageable layer 40, also commonly referred to as a rampant layer, is deposited atop the first surface 22 of the wafer, the ground compliant bumps 32 and the one or more contacts (not shown). In a preferred embodiment, the photoimageable layer 40 is spin coated atop the wafer and the compliant bumps. In one preferred embodiment, the layer 40 is a photoimageable silicone layer such as the silicone commonly sold under the identifier Dow Corning WL-5150 or WL-6910. The photoimageable layer 40 preferably smoothes any sharp edges found on the ground compliant bumps 32. It is preferable to remove the sharp edges to avoid stress concentration so that any conductive elements extending over the edges are not damaged by excessive stress during thermal cycling.

Figure 7:
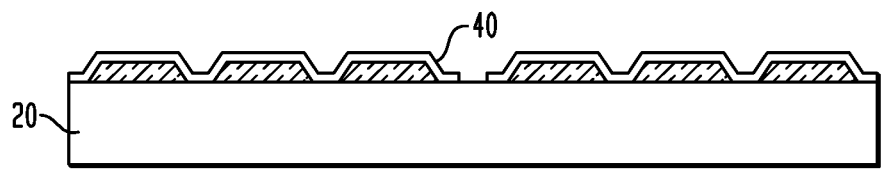

Referring to FIG. 7, portions of the photoimageable layer 40 are selectively removed to expose the one or more contacts (not shown) accessible at the top surface of the wafer 20.

Figure 8:
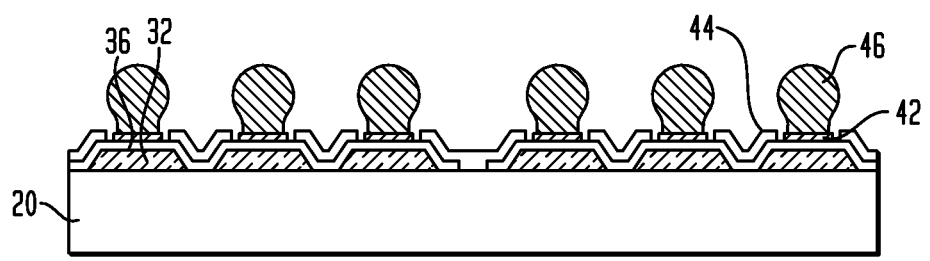
Figure 8A:
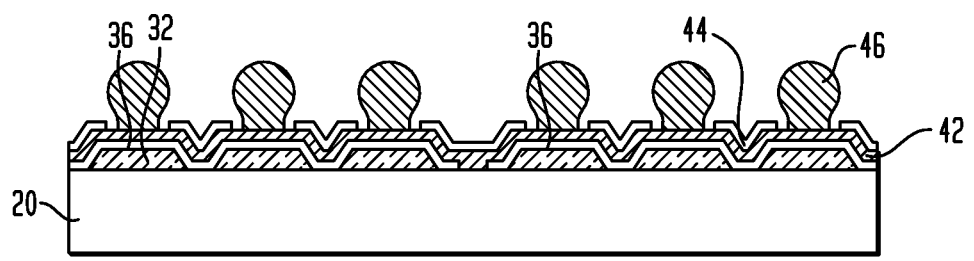

Referring to FIG. 8 (a sectional view taken prior to the connections between the terminals and contacts) and FIG. 8A (a sectional view taken through the connections between the terminals and contacts), conductive traces 42 are formed atop the compliant bumps 32 and the first surface of the wafer 20. The conductive traces 42 preferably have first ends that are electrically interconnected with the one or more contacts (not shown) found on the first surface of the wafer and second ends overlying the planar surfaces 36 provided atop the compliant bumps 32. The conductive traces may be formed by methods such as depositing metal and then removing the metal to form elongated conductive elements. After the conductive traces 42 have been formed, a solder masks layer 44 may be deposited atop the conductive traces 42, the compliant bumps 32 and the first surface of the wafer 20. Portions of the solder mask layer 44 may be removed so as to expose the second ends of the conductive traces 42 that overlie the top planar surfaces 36 of the compliant bumps 32. In order to form an electrical interconnection with an external element such as a printed circuit board, conductive elements 46 such as solder balls may be deposited in the openings in the solder mask layer 44. The conductive elements 46, such as solder balls, are preferably electrically interconnected with the second ends of the conductive traces 42. The conductive elements 46 may be reflowed to form conductive bumps that sit atop the compliant bumps 36. The conductive elements 46 are preferably in contact with the one or more contacts on the wafer 20 through the conductive traces 42.

Referring to FIG. 8, conductive elements 46 are formed atop the second ends of each of the conductive traces. The conductive elements 46 may be plated or deposited so that they project above the top face of the semiconductor wafer or chip. In one preferred embodiment, each conductive element is preferably connected to the second end of the conductive trace.

In one embodiment, the conductive elements 46 may be used to permanently connect the microelectronic assembly with an external substrate such as a printed circuit board. The conductive elements may include fusible materials such as solder. The conductive elements 46 may be reflowed for permanently connecting the microelectronic assembly with a circuitized substrate.

Figure 9:
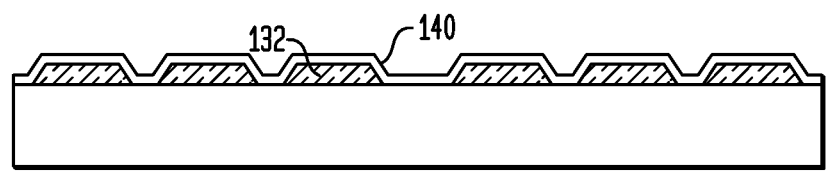
FIGS. 9-11 show a method of making a microelectronic assembly, in accordance with another preferred embodiment of the present invention.

Referring to FIG. 9, in accordance with another embodiment of the present invention, a microelectronic assembly is formed using one or more of the steps described above with respect to FIGS. 1-7. The microelectronic assembly includes a photoimageable layer 140 deposited atop ground compliant bumps 132 having planarized top surfaces.

Figure 10:
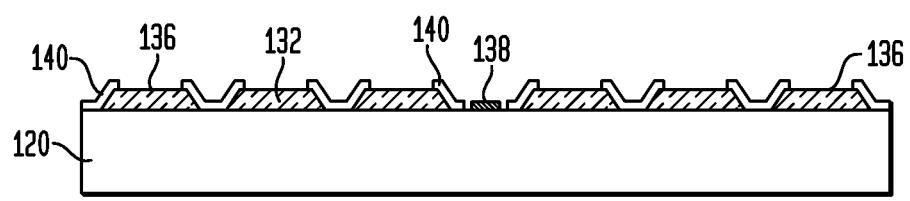

Referring to FIG. 10, portions of the photoimageable layer 140 are selectively removed so as to expose the planar surfaces 136 atop the compliant bumps 132. Removing the photoimageable layer 140 also exposes the one or more contacts 138 accessible at the first surface of the wafer 120. The photoimageable layer 140 is developed in the area of the compliant bumps 132 on top of each bump.

Figure 11:
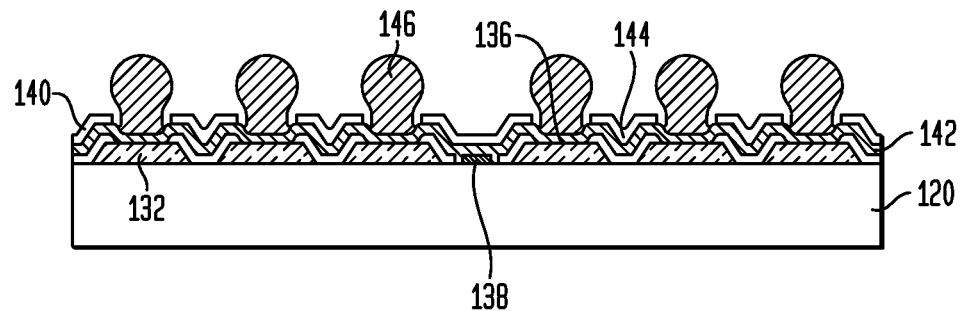

Referring to FIG. 11, conductive traces 142 are preferably formed atop the photoimageable layer 140. The conductive traces 142 preferably extend from the top planar surfaces 136 of the compliant bumps 132 to the one or more contacts (not shown) accessible at the first surface of the wafer 120. The conductive traces 142 may be formed by depositing a layer of conductive metal atop the wafer and selectively removing the metal to form the conductive traces. A layer of a solder resist material 144 is preferably deposited atop the conductive traces 142. The solder resist layer 144 may be selectively removed to expose the second ends of the conductive traces atop the planar surfaces of the compliant bumps 132. Conductive elements 146 such as solder balls, conductive posts or conductive pins may be deposited atop the exposed second ends of the conductive traces 142.

Figure 12:
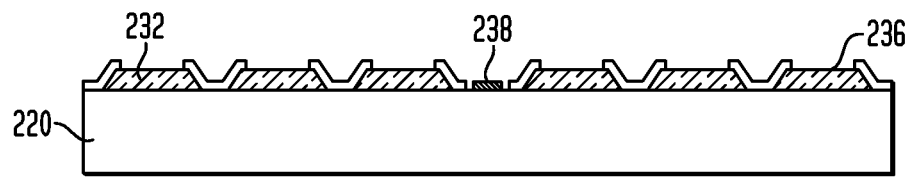
FIGS. 12-13 show a method of making a microelectronic assembly, in accordance with a further preferred embodiment of the present invention.

FIG. 12 shows a microelectronic assembly similar to the assembly shown in FIG. 10. The microelectronic assembly includes a semiconductor wafer 220 having a first surface with one or more contacts 238 accessible at the first surface. The microelectronic assembly also includes compliant bumps 232 having planar surfaces 236.

Figure 13:
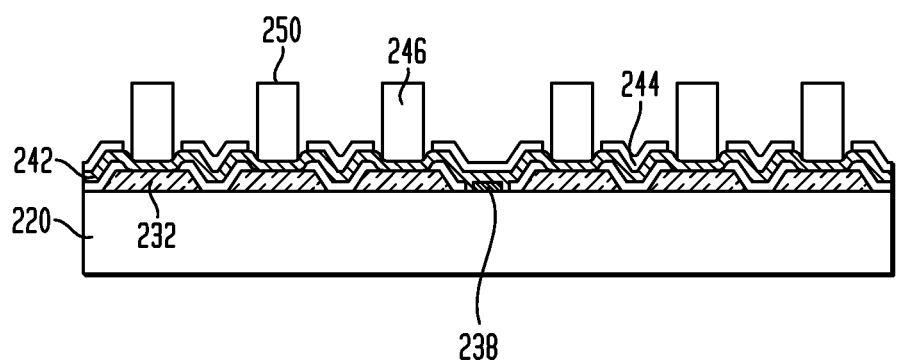
Figure 13A:
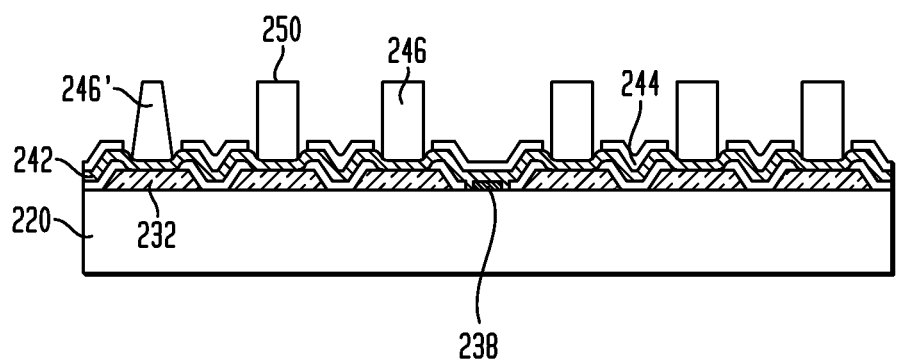
FIG. 13A is an alternative embodiment of FIG. 13.

Referring to FIG. 13, conductive traces 242 are formed atop the compliant bumps 232 having planar surfaces. The conductive traces have first ends that are electrically interconnected with the one or more contacts accessible at the first surface of the wafer 220 and second ends that overlie the planar surfaces 236 of the compliant bumps 232. A solder mask layer 244 may be deposited atop the conductive traces 242. The solder mask layer 244 may be selectively removed to expose the second ends of the conductive traces 242 atop the planar surfaces of the compliant bumps 232. Elongated conductive posts 236 or pins may be provided atop the planar surfaces of the compliant bumps 232. In one preferred embodiment, the conductive posts 246 are plated atop the compliant bumps 232. In other preferred embodiments, the conductive posts 246 are deposited atop the compliant bumps using a mold. In still other preferred embodiments, the conductive posts 246 are pre-formed away from the microelectronic assembly and then attached to the planar surfaces atop the compliant bumps 232. The conductive posts 246 are preferably electrically interconnected with the one or more contacts 238 on the wafer through the conductive traces 242. In one preferred embodiment, the conductive posts 246 have tips that are substantially flat. The substantially flat tips 250 of the conductive posts 246 may lie in a common plane. In an alternative embodiment shown in FIG. 13A, at least one of the conductive posts 246' is frustoconical.

The dimensions of the posts may vary over a significant range. In a preferred embodiment, the posts have a height above the top surface of the compliant layer of about 50-300 micrometers. Each post 246 has a base adjacent the compliant bump and a tip 250 remote from the compliant layer. The conductive posts 246 may be formed from any electrically conductive materials, but desirably are formed from metallic materials such as copper, copper alloys, gold and combinations thereof. For example, the conductive posts 246 may be formed from copper with a layer of gold provided at the surfaces of the posts.

Figure 14A:
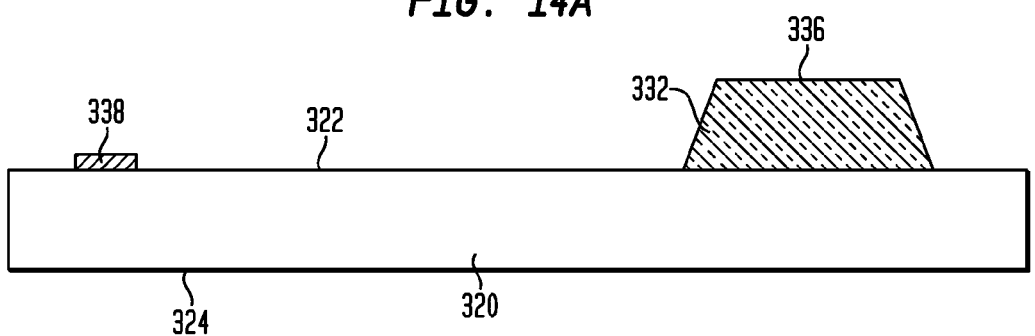
FIGS. 14A-14J show a method of making a microelectronic assembly, in accordance with one preferred embodiment of the present invention.

Referring to FIG. 14A, in one preferred embodiment, a semiconductor wafer 320 such as a DRAM wafer has a top surface 322 and a bottom surface 324 remote therefrom. The wafer 320 includes contacts 338 accessible at the top surface thereof. Compliant bumps 332 are preferably provided atop the top surface 322 of the wafer 320. In one embodiment, the compliant bumps 332 are formed by stenciling or screen printing masses of a curable material atop the wafer 320. The masses of the curable material are preferably cured and then polished or ground to provide compliant bumps 332 having a top planar surface 336 that is substantially flat.

Figure 14B:
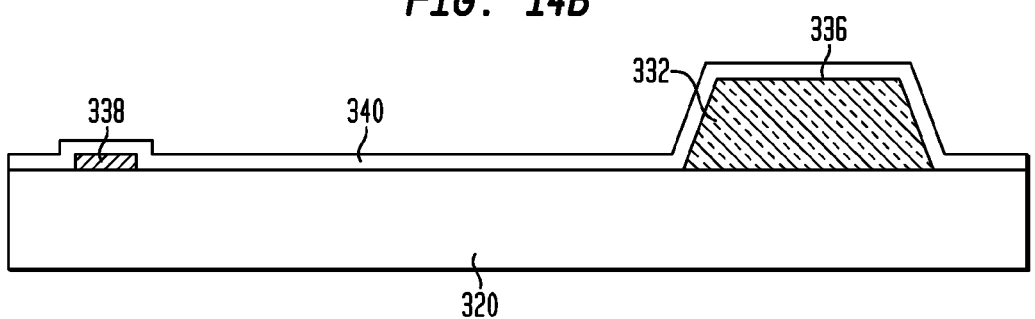

Referring to FIG. 14B, seed layer 340 is desirably deposited over the top surface of the wafer 320, the one or more contacts 338 and the compliant bumps 332. In one preferred embodiment, the seed layer is sputtered over the top surface of the wafer. The seed layer 340 may comprise a conductive metal such as titanium.

Figure 14C:
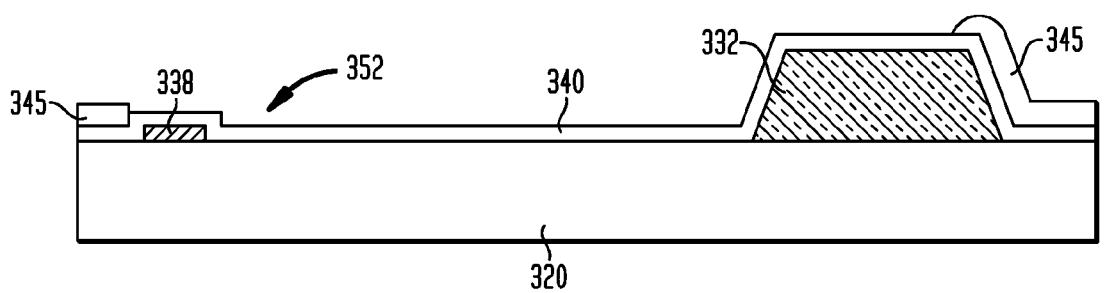

Referring to FIG. 14C, a photo resist layer 345 is deposited atop the seed layer 340. In one preferred embodiment, the photo resist layer 345 is an electrophoretic photoresist layer. The photoresist layer it then exposed and portions of the photoresist layer 345 are selectively removed to provide one or more openings 352.

Figure 14D:
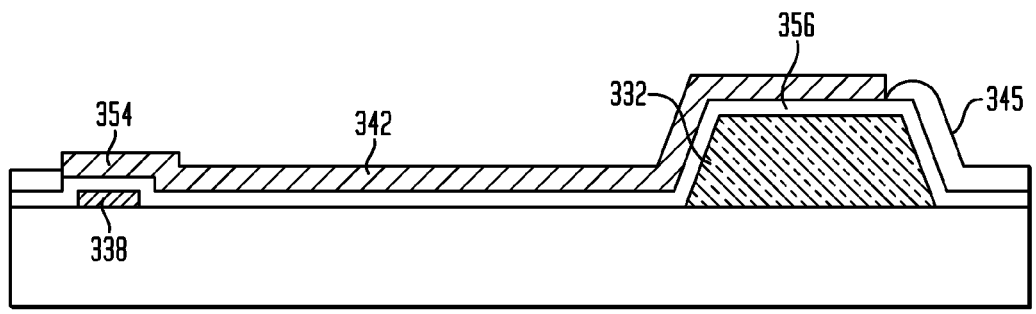

Referring to FIG. 14D, conductive leads or traces 342 are preferably plated atop the openings in the photoresist layer 345. As shown in FIG. 14D, the conductive traces 342 have first ends 354 that are in contact with the contacts 338 on the wafer and second ends 356 that overly the planar surfaces of the compliant pads 332.

Figure 14E:
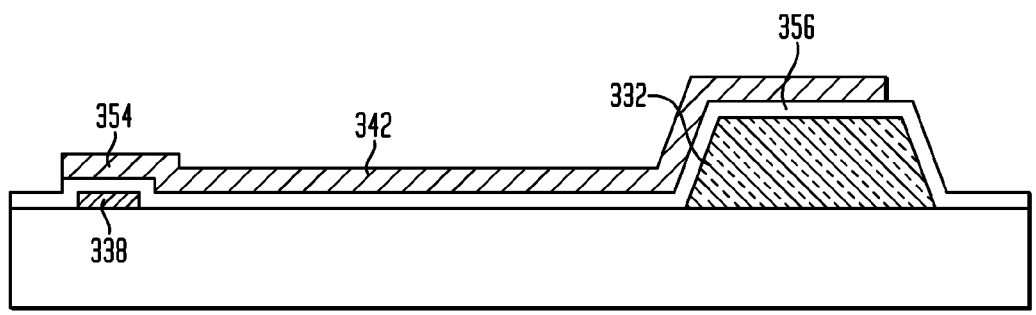
Figure 14F:
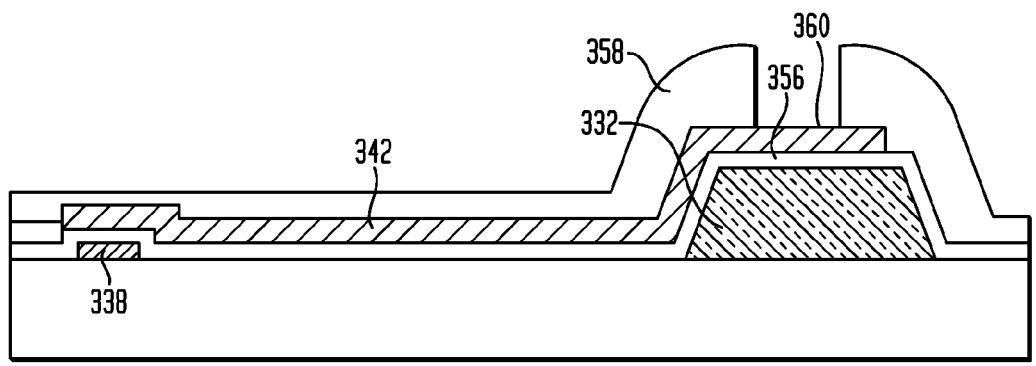

Referring to FIG. 14E, the photoresist layer 345 is then stripped away or removed. Referring to FIG. 14F, a second photoresist layer 358 is deposited over the conductive traces 342, the contacts 338 and the compliant bumps 332. The second photoresist layer 358 may include an electrophoretic photoresist layer. The second resist layer 358 is exposed for creating openings 360 aligned with the second ends 356 of the conductive traces 342.

Figure 14G:
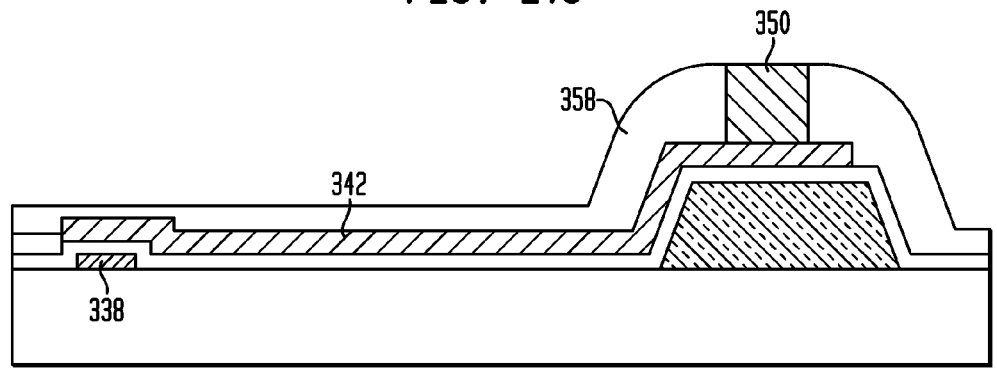

Referring to FIG. 14G, conductive pins 350 are preferably formed atop the compliant bumps by electroplating the pins in the openings in the second photo resist layer 358. In one embodiment, the conductive pins are made of copper.

The conductive posts 350 are preferably electrically interconnected with the contacts 338 on the wafer via the conductive traces 342.

Figure 14H:
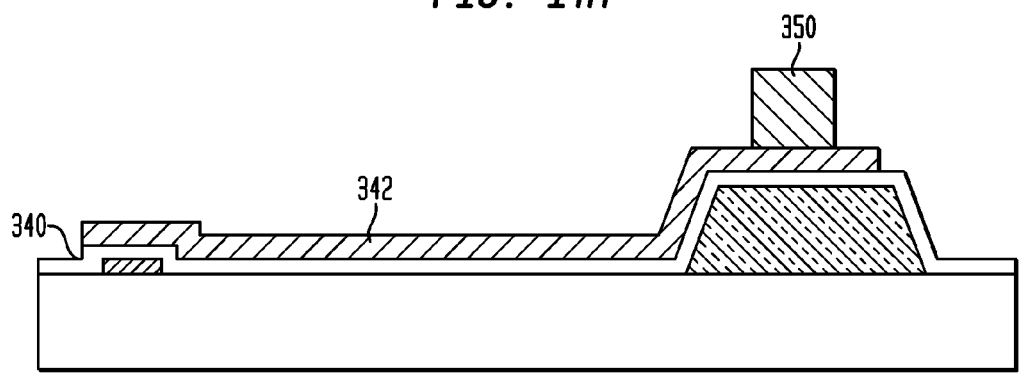
Figure 14I:
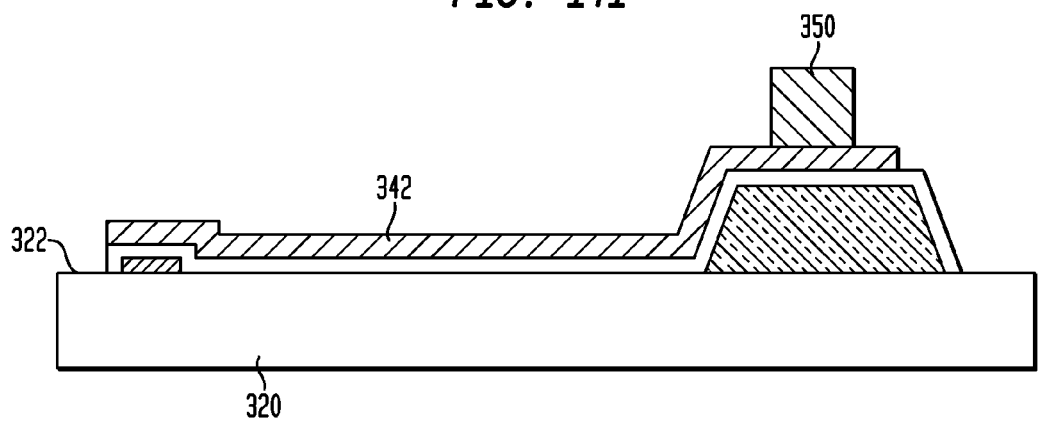

Referring to FIG. 14H, after the conductive posts 350 are plated, the second photoresist layer is removed so as to expose the conductive traces 342. Referring to FIGS. 14H and 14I, the seed layer 340 is removed from the top surface 322 of the wafer 320.

Figure 14J:
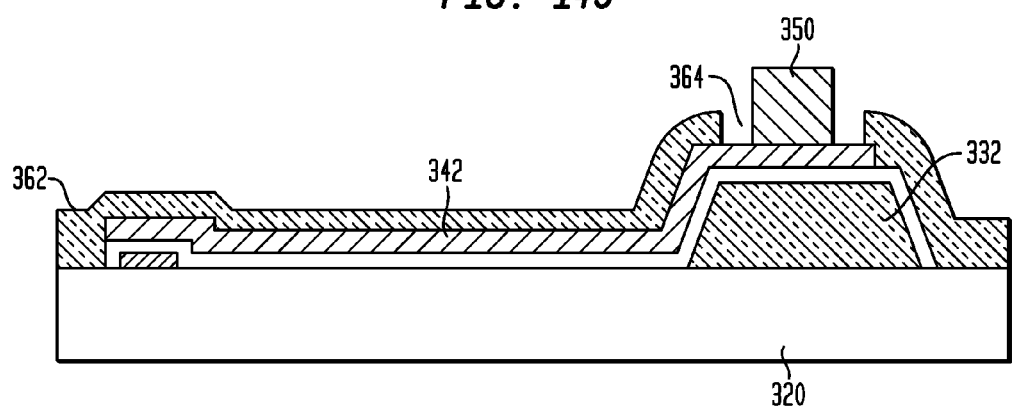

Referring to FIG. 14J, a dielectric overcoat layer 362 or solder mask layer is deposited over the top surface of the wafer 320. The dielectric overcoat layer 362 covers the conductive traces 342 and portions of the compliant bumps 332. The dielectric overcoat layer 362 has openings 364 formed therein through which the conductive posts 350 project.

Figure 15:
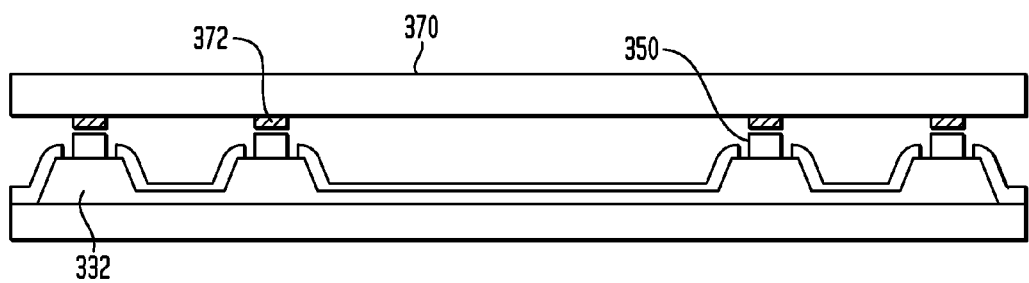
FIG. 15 shows the microelectronic assembly of FIG. 14J being abutted against a test board.

Referring to FIG. 15, the wafer level assembly of FIG. 14J may be tested by providing a test board 370 having conductive elements such as probe pins 372. The probe pins 372 are abutted against the conductive posts 350 on the microelectronic assembly for burning-in and/or testing the microelectronic assembly. Any non-planarities between the probe pins 372 and the conductive posts 350 are compensated for by the compliance of the compliant bump 332. In an alternative embodiment, in lieu of the test board 370, a circuit board or panel (also 370) can be connected to the wafer level assembly to provide for a more permanent connection.

Conventional die-level burn-in (BI) techniques utilize temporary die carriers for individual die burn-in and testing. The need for mounting individual dies onto such temporary carriers greatly increases the cost of burn-in in mass production techniques. Conventional wafer-lever burn-in (WLBI) techniques typically include the sacrificial metal layer method and the direct contact method. The sacrificial metal layer method requires deposition of a temporary redistribution metal layer, which is removed after testing, thus increasing the complexity of the manufacturing process. The other problem is that the burn-in is performed before packaging and the bare die is much more sensitive to the environment compared to a packaged product, thus reducing the yield due to handling and environmental problems. The direct contact wafer-level burn-in method allows testing of many devices in parallel. A full wafer contactor that interfaces with every pin independently of the burn-in system is implemented by micro-springs or by pogo pins. However, full contact probe cards with a very high pin count and a small pitch are very expensive.

The present invention incorporates compliancy in the package. A compliant bump provided under each individual input/output makes it possible to perform wafer level testing without an interposer, since the compliant bumps will compensate for non-planarity of the input/outputs by their deformation during wafer level probing. Moreover, in preferred embodiments, copper pins or conductive posts replace BGA balls so as to require less probing force and less contact resistance. Moreover, the present invention allows wafer-level burn-in [WLBI] and testing while not suffering from each of the problems identified above.

The dimensions of the posts may vary over a significant range. In one preferred embodiment, the posts have a height above the top surface of the compliant layer of about 50-300 micrometers. Each post 246 has a base adjacent the compliant bump and a tip 250 remote from the compliant layer. The conductive posts 246 may be formed from any electrically conductive materials, but desirably are formed from metallic materials such as copper, copper alloys, gold and combinations thereof. For example, the conductive posts 246 may be formed from copper with a layer of gold provided at the surfaces of the posts.

In one preferred embodiment, conventional processes such as plating may form the conductive traces and the conductive posts may be formed using the methods disclosed in commonly assigned U.S. Pat. No. 6,177,636, the disclosure of which is hereby incorporated by reference herein. In yet other preferred embodiments, the conductive posts may be fabricated as individual elements and assembled to the microelectronic assembly in any suitable manner that connects the conductive posts to the second ends of the conductive traces. In still other preferred embodiments, the assembly may be formed by depositing a seed layer, plating conductive traces having first ends connected with the contacts of the microelectronic element and second ends disposed atop the compliant layer, plating the conductive posts atop the compliant layer and in contact with the conductive traces and removing the seed layer. The assembly may also be formed by electrolessly plating the conductive posts. The conductive posts may be formed by electrolessly plating the posts using copper or nickel. In other embodiments, conductive elements such as conductive pins or balls may be provided over the second ends of the conductive traces using any of the methods described herein.

In order to test the microelectronic assembly, the tips 250 of the conductive posts 246 are juxtaposed with conductive pads of a circuitized substrate. The tips 250 may be pressed against the conductive pads. The compliant bumps 232 enable the tips of the conductive posts to move relative to the contacts on the wafer 220 to accommodate for non-planarities between the posts and the conductive pads, as well as for thermal mismatch. If the test of the microelectronic assembly is successful, the assembly may be permanently attached to a substrate such as a printed circuit board by using solder or another fusible or conductive material.

In one preferred embodiment of the present invention, the conductive posts may be generally frustoconical in shape, whereby the base and the tip of each post are substantially circular. In these particular preferred embodiments, the bases of the posts typically are about 100-600 micrometers in diameter, whereas the tips typically are about 40-200 micrometers in diameter. The exterior surfaces of the conductive posts may be optionally plated with a highly conductive layer, such as gold, gold/nickel, gold/osmium or gold/palladium, or alternately plated with a wear resistant, conductive coating such as osmium to ensure that a good connection is made when the post are either soldered or socketed to a substrate.

In a preferred embodiment of the present invention, the posts may have a shape that facilitates a tilting motion that causes the tip of each post to wipe across an opposing contact pad as the tip is engaged with the contact pad. This tilting motion promotes reliable electrical contact. As discussed in greater detail in the co-pending, commonly assigned U.S. patent application Ser. No. 10/985,126, filed Nov. 10, 2004, entitled "MICRO PIN GRID ARRAY WITH WIPING ACTION," the disclosure of which is incorporated by reference herein, the posts may be provided with features which promote such wiping action and otherwise facilitate engagement of the posts and contacts. Conductive posts having other shapes and designs that promote wiping and/or good electrical contact are disclosed in greater detail in co-pending, commonly assigned U.S. patent application Ser. No. 10/985,119, filed Nov. 10, 2004, entitled "MICRO PIN GRID WITH PIN MOTION ISOLATION," and commonly assigned U.S. patent application Ser. No. 11/014,439, filed Dec. 16, 2004, entitled "MICROELECTRONIC PACKAGES AND METHODS THEREFOR," the disclosures of which is hereby incorporated by reference herein.

In one preferred embodiment of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

The posts may also be fabricated by a process such as that disclosed in co-pending, commonly assigned U.S. patent application Ser. No. 10/959,465, filed Oct. 6, 2004 and entitled "Formation of Circuitry With Modification of Feature Height," the disclosure of which is hereby incorporated by reference herein.

Although the present invention is not limited by any particular theory of operation, it is believed that providing conductive elements atop a compliant material as disclosed herein will provide a compliant wafer-level or chip package that accommodates thermal mismatch and insures the formation of proper electrical interconnections. In addition, the use of conductive pins or posts enables the microelectronic assemblies and/or wafers to be tested by abutting the tips of the conductive posts directly against the contacts on a test board, without requiring the use of a test socket.

Although the present disclosure provides a particular sequence for making the microelectronic assemblies and wafers described herein, the order of the sequence may be altered and still fall within the scope of the present invention.

In one preferred embodiment, the structures disclosed herein may be used to make a test board having a compliant layer and conductive elements, solder balls, conductive posts or conductive pins projecting from the compliant layer. The contacts on a bare wafer or die may be abutted against the tips of the conductive posts for testing the wafer or die.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:
    a semiconductor wafer having a first surface and contacts accessible at the first surface;
    a plurality of compliant bumps of dielectric material overlying the first surface of the semiconductor wafer, the plurality of compliant bumps having coplanar top surfaces;
    conductive traces electrically connected with the contacts and extending therefrom to overlie the coplanar top surfaces of the compliant bumps;
    a first dielectric layer having openings and overlying the conductive traces;
    a second dielectric layer overlying the first surface of the semiconductor wafer and at least edges of the compliant bumps; and
    conductive elements overlying the coplanar top surfaces, the conductive elements extending through the openings in the first dielectric layer and in contact with the conductive traces.

2. The assembly as claimed in claim 1, wherein the conductive elements are selected from the group consisting of solder balls, conductive posts and conductive pins.

3. The assembly as claimed in claim 1, further comprising a circuit panel, wherein the conductive elements include terminals of the assembly for electrical connection with corresponding contact elements of the circuit panel.

4. The assembly as claimed in claim 3, wherein the terminals include at least one terminal which is disposed singly atop one of the plurality of compliant bumps.

5. The assembly as claimed in claim 3, wherein the terminals are bonded to the contact elements of the circuit panel.

6. The assembly as claimed in claim 1, wherein the semiconductor wafer comprises one or more memory chips.

7. The assembly as claimed in claim 1, wherein the conductive elements are rigid solid metal posts.

8. The assembly as claimed in claim 7, wherein the rigid solid metal posts are frustoconical.

9. The assembly as claimed in claim 7, wherein the rigid solid metal posts are plated posts.

10. The assembly as claimed in claim 7, wherein the rigid solid metal posts have a height above the top surface of the compliant layer ranging from 50-300 micrometers.

11. A microelectronic assembly comprising:
    a semiconductor wafer having a first surface and contacts accessible at the first surface;
    compliant bumps of dielectric material overlying the first surface of the semiconductor wafer, each of the compliant bumps having a planar top surface;
    a first dielectric layer overlying the first surface of the semiconductor wafer and at least edges of the compliant bumps, wherein the planar top surfaces of the compliant bumps and the contacts are accessible through the dielectric layer;
    conductive traces electrically connected with the contacts and extending therefrom to overlie the planar top surfaces of the compliant bumps;
    a second dielectric layer having openings, portions of the conductive traces being exposed through the openings; and
    conductive elements overlying the planar top surfaces in contact with the conductive traces.

12. The assembly as claimed in claim 11, wherein the first dielectric layer includes a photoimageable material.

13. The assembly as claimed in claim 12, wherein the photoimageable material includes silicone.

14. The assembly as claimed in claim 11, wherein the first dielectric layer is compliant.

15. The assembly as claimed in claim 11, wherein the conductive elements are selected from the group consisting of solder balls, conductive posts and conductive pins.

16. The assembly as claimed in claim 11, further comprising a circuit panel, wherein the conductive elements include terminals of the assembly for electrical connection with corresponding contact elements of a circuit panel.

17. The assembly as claimed in claim 16, wherein the terminals include at least one terminal which is disposed singly atop one of the compliant bumps.

18. The assembly, as claimed in claim 11, wherein the conductive elements are rigid solid metal posts.

19. The assembly as claimed in claim 18, wherein the conductive posts are frustoconical.

20. The assembly as claimed in claim 18, wherein the conductive posts have a height above the top surface of the compliant layer ranging from 50-300 micrometers.

* * * * *